(12) United States Patent
Toliver et al.

(10) Patent No.: US 6,853,258 B2
(45) Date of Patent: Feb. 8, 2005

(54) STABLE OSCILLATOR

(75) Inventors: Christopher M. Toliver, West Newton, MA (US); Stephen T. English, Billerica, MA (US); Eric G. Nestler, Harvard, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/230,663

(22) Filed: Aug. 29, 2002

(65) Prior Publication Data

US 2003/0155985 A1 Aug. 21, 2003

Related U.S. Application Data

(60) Provisional application No. 60/357,319, filed on Feb. 15, 2002.

(51) Int. Cl.[7] .............................................. H03K 3/0231
(52) U.S. Cl. .................. 331/34; 331/111; 331/143; 331/175; 331/177 R
(58) Field of Search ........................... 331/34, 111, 143, 331/175, 177 R

(56) References Cited

U.S. PATENT DOCUMENTS

| | | | |
|---|---|---|---|
| 4,723,114 A | 2/1988 | D'Arrigo et al. | 331/111 |
| 5,070,311 A | 12/1991 | Nicolai | 331/111 |
| 5,745,323 A | 4/1998 | English et al. | 361/56 |
| 5,760,617 A | 6/1998 | Coln et al. | 327/101 |
| 5,859,571 A | 1/1999 | Lee et al. | 331/53 |
| 5,862,069 A | 1/1999 | Nestler | 364/754.01 |
| 5,872,469 A | 2/1999 | Nestler | 327/91 |

OTHER PUBLICATIONS

Analog Devices, Inc., Active Energy Metering IC With DI/DT Sensor Interface, ADE7759, pp. 1–33, 2001.

Analog Devices, Inc., Energy Metering IC With Integrated Oscillator, ADE7757, pp. 1–15, 2002.

South African Micro–Electronics Systems LTD, Pin Selectable Three Phase Power/Energy Metering IC for Stepper Motor/Impulse Counter Applications With Anti Tamper Features, SA2005M, pp. 1–12, May, 9, 2002.

Primary Examiner—Kenneth B. Wells
(74) Attorney, Agent, or Firm—Bromberg & Sunstein LLP

(57) ABSTRACT

An oscillator includes a comparator and a variable voltage element. The comparator has a first input set to a reference voltage, a second input, and an output configured to produce an output voltage as a function of the voltages at the first and second inputs. The variable voltage element delivers to the second input a second voltage that is a function of a switched current. The switched current is a function of the reference voltage.

21 Claims, 6 Drawing Sheets

STABLE OSCILLATOR

PRIORITY

This patent application claims priority from U.S. provisional patent application No. 60/357,319, filed Feb. 15, 2002, naming Christopher M. Toliver, Stephen T. English, and Eric G. Nestler as co-inventors, and entitled, "Low Drift Oscillator," the disclosure of which is incorporated herein, in its entirety, by reference.

FIELD OF THE INVENTION

The invention generally relates to electronic clocking circuits and, more particularly, the invention relates to maintaining the accuracy of electronic clocking circuits in uncertain environments.

BACKGROUND OF THE INVENTION

Electronic clocking circuits (hereinafter "clocking circuits") are used in a wide variety of applications. For example, many solid state electronic devices (e.g., microprocessors) operate at a rate set by an internal or external clocking circuit. Accordingly, the accuracy of the clocking signal generated by a clocking circuit generally is critical to the proper operation of the underlying device being clocked. Many devices thus use conventional crystal oscillators to clock their underlying processes.

Crystal oscillators have a number of drawbacks. Among others, crystal oscillators typically are relatively large and expensive. Consequently, noncrystal clocking circuits have been developed to provide the same function while crystal being both smaller and less expensive. One problem with conventional non clocking circuits, however, is their susceptibility to malfunctioning in extreme environments. Another problem is their processing variability.

More particularly, due to their widespread use, clocking circuits are deployed in a broad array of different environments. For example, outdoor electric meters (for determining the amount of electricity consumed by a house) sometimes have clocking circuits. Clocking circuits in such environments can be subjected to a wide range of temperatures. Typical temperatures can range from 10 degrees below zero F. (e.g., Alaska) to 120 degrees F (e.g., Arizona). In some parts of the world, temperatures can even exceed these temperatures, or range across this entire spectrum during a four season period.

Properties of components within clocking circuits often change when subjected to varying temperature extremes. For example, varying temperatures can affect 1) the capacitance values of capacitors, 2) input and reference voltages, and 3) various thresholds. Such changes can cause the clocking circuit to deliver a varying output clocking frequency, thus causing the device being clocked to operate improperly.

SUMMARY OF THE INVENTION

In accordance with one aspect of the invention, an oscillator includes a comparator and a variable voltage element. The comparator has a first input set to a reference voltage, a second input, and an output configured to produce an output voltage as a function of the voltages at the first and second inputs. The variable voltage element delivers to the second input a second voltage that is a function of a switched current. The switched current is a function of the reference voltage.

In some embodiments, the variable voltage element includes a capacitive element having a voltage that is a function of the switched current. The oscillator also may have a set of switches that selectively deliver the switched current to the variable voltage element. The set of switches switch as a function of the comparator output voltage.

A current source also may be included for producing the switched current as a function of a calibration current. The calibration current is a function of the reference voltage. The current source may have a calibration resistor device that sets the calibration current. The calibration resistor device may have a voltage across it that is substantially equal to the reference voltage.

The oscillator also may include a smoothing module having a module input coupled with the comparator output. The smoothing module also has a module output for delivering a smoothed output signal. The smoothed output signal is substantially free of jitter. In addition, the smoothing module may include a latch coupled with a delay device at a given node. The latch may have an input, and the smoothing module may have a feedback loop from the given node to the input of the latch.

In accordance with another aspect of the invention, an oscillator has a variable voltage element for producing a variable voltage, a voltage producing device producing an output voltage signal, and an output for transmitting the output voltage signal. The oscillator also includes a switching arrangement for selectively delivering a drive signal to the variable voltage element based upon the output voltage signal. The voltage producing device receives a reference voltage and the variable voltage, and the output voltage signal is a function of the reference voltage and the variable voltage. The drive signal is a function of the reference voltage.

The oscillator also may include a feedback loop coupling the output with the switching arrangement. In other embodiments, the variable voltage element includes a capacitive element having a voltage that is a function of the drive signal. By way of example, the drive signal may be a current.

In addition, the oscillator receives current from a current source for producing the drive signal as a function of a calibration current. The calibration current is a function of the reference voltage. The current source may include a calibration resistor device that sets the calibration current. The calibration resistor device has a voltage that is substantially equal to the reference voltage.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

In illustrative embodiments of the invention, an oscillator maintains its output timing signal at a substantially constant frequency by compensating for unintended changes in operating parameters, such as supply voltage and temperature. In addition, the oscillator also compensates for unintended variability in component values, such as transistor circuitry (e.g., NMOS, PMOS, and CMOS circuitry) within reference voltage producing circuitry. Details of various details are discussed below.

Figure 1A:
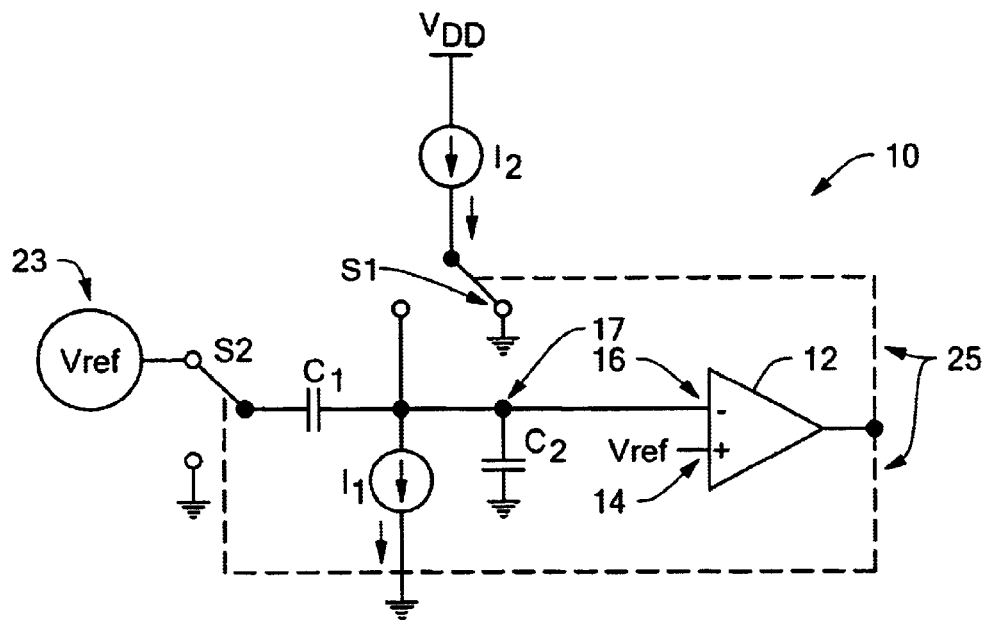
FIG. 1A schematically shows an illustrative oscillator switched into a discharge state.
Figure 1B:
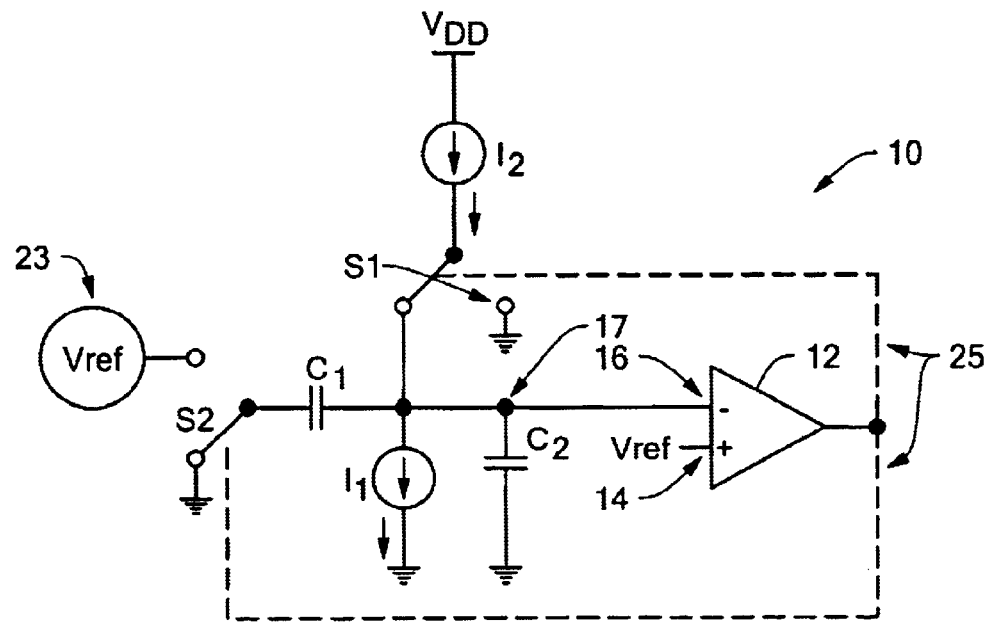
FIG. 1B schematically shows the oscillator shown in FIG. 1 in a charging state.

FIGS. 1A and 1B schematically show an oscillator 10 configured in accordance with illustrative embodiments of the invention. FIG. 1A shows the oscillator 10 in a low mode, while FIG. 1B shows the oscillator 10 in a high mode. When in the low mode, the oscillator output generates a logical zero output, while when in the high mode, the oscillator 10 generates a logical one output. Accordingly, in illustrative embodiments, the oscillator 10 generates a precise output clocking signal that alternates between logical one and logical zero.

To that end, the oscillator 10 includes a comparator 12 for generating the output signal, and a varying voltage element for varying an input voltage to the comparator 12. More particularly, the comparator 12 illustratively is an amplifier having a positive input terminal 14 set to a reference voltage Vref, and a negative input terminal 16 that receives an input voltage from the varying voltage element. The amplifier produces a high output signal when the voltage in its positive input terminal is more positive than the voltage at its negative input terminal. Conversely, the amplifier produces a low output signal when the voltage in its negative input terminal is more positive than the voltage at its positive input terminal.

Because the voltage at the positive input terminal 14 is set to a fixed DC voltage (i.e., the reference voltage Vref), the voltage at the negative input terminal 16 is varied to vary the output signal. In illustrative embodiments, the voltage at the negative input terminal 16 is carefully controlled to change at specific times to produce an output signal with a constant frequency. To that end, the oscillator 10 also includes a pair of switches S1 and S2 that are switched at specific times to vary the voltage produced by the varying voltage element.

More specifically, the varying voltage element includes a first capacitor C1 having a common node 17 with a second capacitor C2 that is directly coupled with the negative input terminal 16 of the comparator 12. The common node 17 is connected to a discharge branch 18 of a current source 22 (FIG. 4) for delivering a discharging current I1 to that node 17. In illustrative embodiments, the current source 22 is a current mirror, such as those shown in FIGS. 3 and 4 and discussed in greater detail below.

Based upon the state of the output signal (i.e., either high or low), the pair of switches S1 and S2 selectively couple the varying voltage element with 1) a charge branch 20 of the current source 22 (i.e., switched by the first switch S1) and 2) a voltage source 23 equal to the reference voltage Vref (i.e., switched by the second switch S2). Consequently, to receive the output signal, both switches S1 and S2 are coupled to the output of the comparator 12 by a feedback loop 25.

More particularly, the switches S1 and S2 are transistors (e.g., MOSFETS) that are configured to logically switch positions when the amplitude of the output signal changes between logical zero to logical one. As shown in the figures, the first switch S1 alternately connects and disconnects the common node 17 of the variable voltage element to the noted charge branch 20 of the current source 22. When connected in such a manner, the variable voltage element receives a charging current I2. When not connecting the variable voltage element with the charge branch 20, the first switch S1 connects the charge branch 20 to ground. In a corresponding manner, the second switch S2 selectively connects the first capacitor C1 to either the voltage source 23 (shown in the drawings as Vref) or ground.

Figure 2:
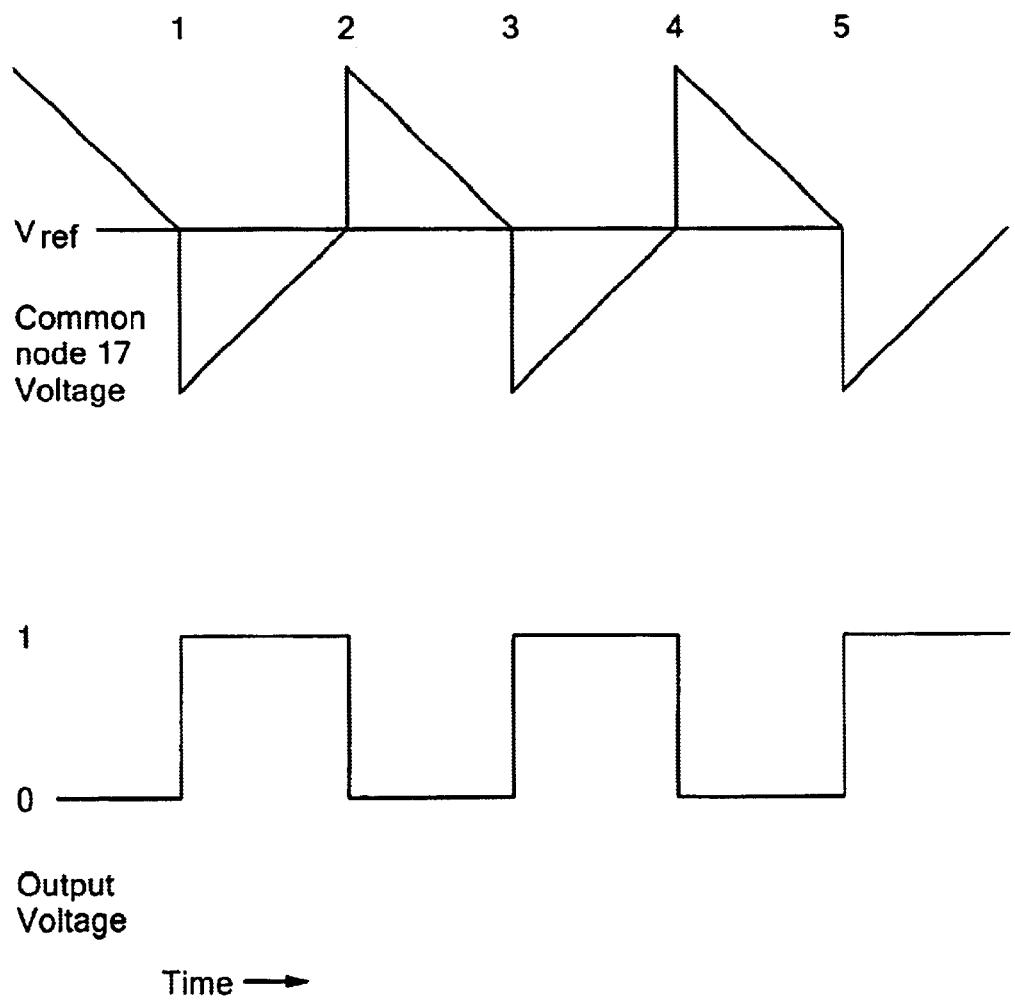
FIG. 2 graphically illustrates the ideal relationship between a fluctuating voltage within the oscillator shown in FIG. 1 and the output voltage of such oscillator.

FIG. 2 graphically shows the relationship between the voltage at the common node 17 (i.e., at the negative input terminal 16 of the comparator 12) and the output voltage. The top waveform shows the voltage on the common node 17, while the bottom waveform shows the output voltage signal. The output voltage signal illustratively is a constant frequency signal.

In summary, for a substantial majority of time of each cycle, the voltage of the common node 17 continually approaches the reference voltage from either a high or low voltage. FIG. 2 clearly shows this. When the voltage of the common node 17 equals the reference voltage Vref (i.e., the voltage at the positive input terminal 14 of the comparator 12), the comparator 12 switches the output signal to its opposite state (i.e., either logical zero or logical one), which causes the switches S1 and S2 to switch. This switching causes the voltage of the common node 17 to quickly reach the opposite voltage extreme (either a high voltage or a low voltage). After such voltage extreme is reached, the voltage at the common node 17 again begins to approach the reference voltage Vref. When the voltage of the common node 17 again equals the reference voltage Vref, the comparator 12 once again switches to an opposite state, thus repeating the process. This process repeats to produce a uniform frequency output signal.

More specifically, beginning at time 1 (shown in FIG. 2 above the common node waveform), the common node voltage is at its lowest voltage relative to the reference voltage Vref (e.g., one volt below the reference voltage Vref). In a corresponding manner, the output voltage is at logical one. At this point in time, the oscillator 10 is in the beginning of its high mode, which is shown in FIG. 1B. As time continues toward time 2, the common node voltage increases toward the reference voltage Vref. In particular, the voltage at the common node 17 increases as the charging current I2 charges the capacitors C1 and C2 (i.e., as the charging current I2 overcomes the discharging current I1, generally referred to herein as "I2-I1"). As known by those skilled in the art, the rate of change that the common node voltage increases equals the quotient of the charging current I2-I1 and the effective capacitance C1+C2 (i.e., (I2-I1)/(C1+C2) ). To maintain a constant frequency output, both the charging current I2-I1 and effective capacitance C1+C2 are constant values throughout each cycle.

The common node voltage increases until it equals the reference voltage (at time 2). Because the negative input terminal 16 voltage of the comparator 12 now is equal to (or slightly greater than) the positive input terminal voltage, the output signal switches to logical zero. The switches S1 and S2 then detect this change in logic level and, consequently, switch to the low state as shown in FIG. 1A. This causes the common node voltage to charge quickly to a maximum voltage above the reference voltage Vref (e.g., one volt greater than the reference voltage Vref. The charging current I2 no longer is connected to the common node 17, while the voltage source 23 now is connected to the first capacitor C1. After the switches S1 and S2 switch, the discharging current I1 drains charge from the capacitors C1 and C2 at a rate equal to the quotient of I1 and C1+C2 (i.e., I1/(C1+C2) ).

The common node voltage thus decreases at this constant rate until it equals the reference voltage Vref (at time 3). Because the negative input terminal 16 of the comparator 12 now is equal to (or slightly smaller) than the positive input terminal 14 voltage, the output signal switches to logical one. The switches S1 and S2 then detect this change in logic level and, consequently, switch back to the high state as shown in FIG. 1B. This causes the common node voltage to discharge very rapidly to a minimum voltage below the reference voltage Vref. More specifically, the charging current I2 now is connected to the common node 17, while the voltage source 23 is disconnected from the first capacitor C1. After the switches S1 and S2 switch, the charging current I2-I1 again charges the second capacitor C2 as discussed above. This process repeats to produce the noted constant frequency output signal.

In accordance with illustrative embodiments, the current source 22 is configured to increase or decrease the charging and discharging currents I2 and I1 as various operating and device parameters fluctuate. This increase/decrease in current compensates for such fluctuations, thus ensuring that the oscillator 10 generates a substantially constant frequency output signal regardless of fluctuating parameters in the circuitry generating the reference voltage Vref.

Figure 3:
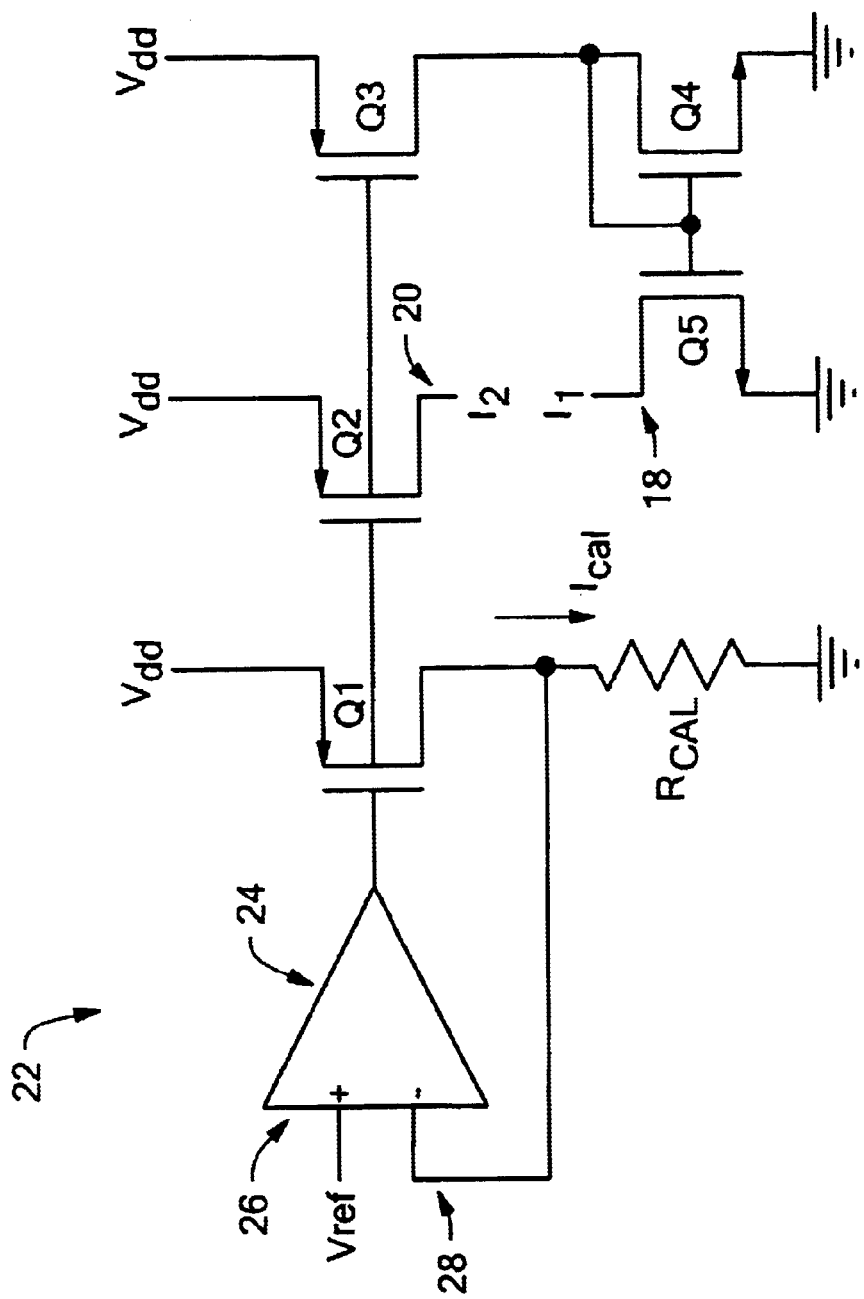
FIG. 3 schematically shows a first exemplary current source that may be used in illustrative embodiments of the invention.

To these ends, FIG. 3 shows an exemplary current mirror that may be used with illustrative embodiments of the invention. The current mirror includes a mirror amplifier 24 coupled with first, second, third, fourth, and fifth mirror transistors (e.g., MOSFETS), and an external (or internal) calibration resistor Rcal. The mirror transistors respectively are identified in the drawings as transistors Q1, Q2, Q3, Q4, and Q5. In illustrative embodiments, the mirror amplifier 24 is an operational amplifier having a positive terminal 26 set to the same reference voltage Vref as that of the positive input terminal 14 of the oscillator comparator 12. In addition, the negative terminal 28 of the mirror amplifier 24 is coupled with one terminal of the calibration resistor Rcal, which has a second terminal coupled to ground.

The current mirror also includes the above noted charge branch 20 for delivering the charging current I2, and the above noted discharge branch 18 for delivering the discharging current I1. Because the voltage at the negative terminal 28 of the mirror amplifier 24 is substantially equal to the voltage at its positive terminal 26, the voltage across the calibration resistor Rcal equals the reference voltage Vref. This voltage thus produces a calibration current through the calibration resistor Rcal equal to the quotient of the reference voltage Vref and the calibration resistor Rcal (i.e., Vref/Rcal). The calibration current Ical consequently generates a current through the first mirror transistor Q1, which 1) has its gate connected to the gates of the second and third mirror transistors Q2 and Q3, and 2) has its source connected to the sources of the second and third mirror transistors Q2 and Q3. Because the gates of the first, second, and third mirror transistors Q1, Q2, and Q3 are connected, the calibration current Ical produces corresponding currents through the second and third mirror transistors Q2 and Q3. Among other things, the sizes of the corresponding currents are based upon the relative areas of the three mirror transistors Q1, Q2, and Q3. One of those produced currents is the charging current I2, which is generated through the second mirror transistor Q2. In a similar manner, the current through the third transistor Q3 also generates similar corresponding currents through the fourth and fifth mirror transistors Q4 and Q5, thus producing the discharging current I1.

There are times when the frequency of the output signal should be modified. For example, when the oscillator 10 is manufactured entirely of transistor elements (e.g., CMOS), the actual capacitance of the capacitors C1 and C2 may vary from their intended (nominal) capacitances. In some cases, the actual capacitance may vary up to twenty percent from the intended capacitance. This variability in capacitance undesirably can affect the ultimate frequency of the output signal by changing the charging and discharging rates discussed above with regard to FIG. 2.

Illustrative embodiments permit the output frequency to be changed merely by changing the resistance of the calibration resistor Rcal. More particularly, as noted above, the frequency of the output signal of the oscillator 10 is dependent upon the size of the calibration current Ical, which is a function of the calibration resistor Rcal and the reference voltage Vref. Accordingly, the frequency of the oscillator 10 can be modified by modifying the resistance of the calibration resistor Rcal. The calibration resistor Rcal thus may be a varying resistor to simplify the process of changing the oscillator frequency, or a fixed resistance value resistor. When it is a fixed value resistance resistor, the calibration resistor Rcal is physically changed to change the output frequency.

There also are some applications in which the reference voltage Vref undesirably varies. For example, when the oscillator 10 is used in an outdoor solid state electric meter, the reference voltage Vref can vary based upon the extremes in temperature. The current source 22 and oscillator 10 described herein, however, automatically compensate for changes in the reference voltage Vref by causing a corresponding change in the calibration current Ical. Specifically, because the calibration current Ical is the quotient of the reference voltage Vref and the calibration resistor Rcal, it necessarily changes in a directly proportional manner to the reference voltage Vref. This consequently causes the corresponding currents in the other mirror transistors Q2–Q5 to change on a like manner, thus causing the charging and discharging currents I2 and I1 to change in a corresponding manner.

Accordingly, the rate of charging and discharging the capacitor C2 (i.e., at the common node 17) changes at this same rate. In illustrative embodiments, this change coincides with increases and decreases in reference voltage Vref in a manner that ensures a constant frequency output signal. In other words, because of the noted relationships between the reference voltage Vref and currents within the current mirror, the output signal maintains a constant frequency even when the reference voltage Vref changes.

Figure 4:
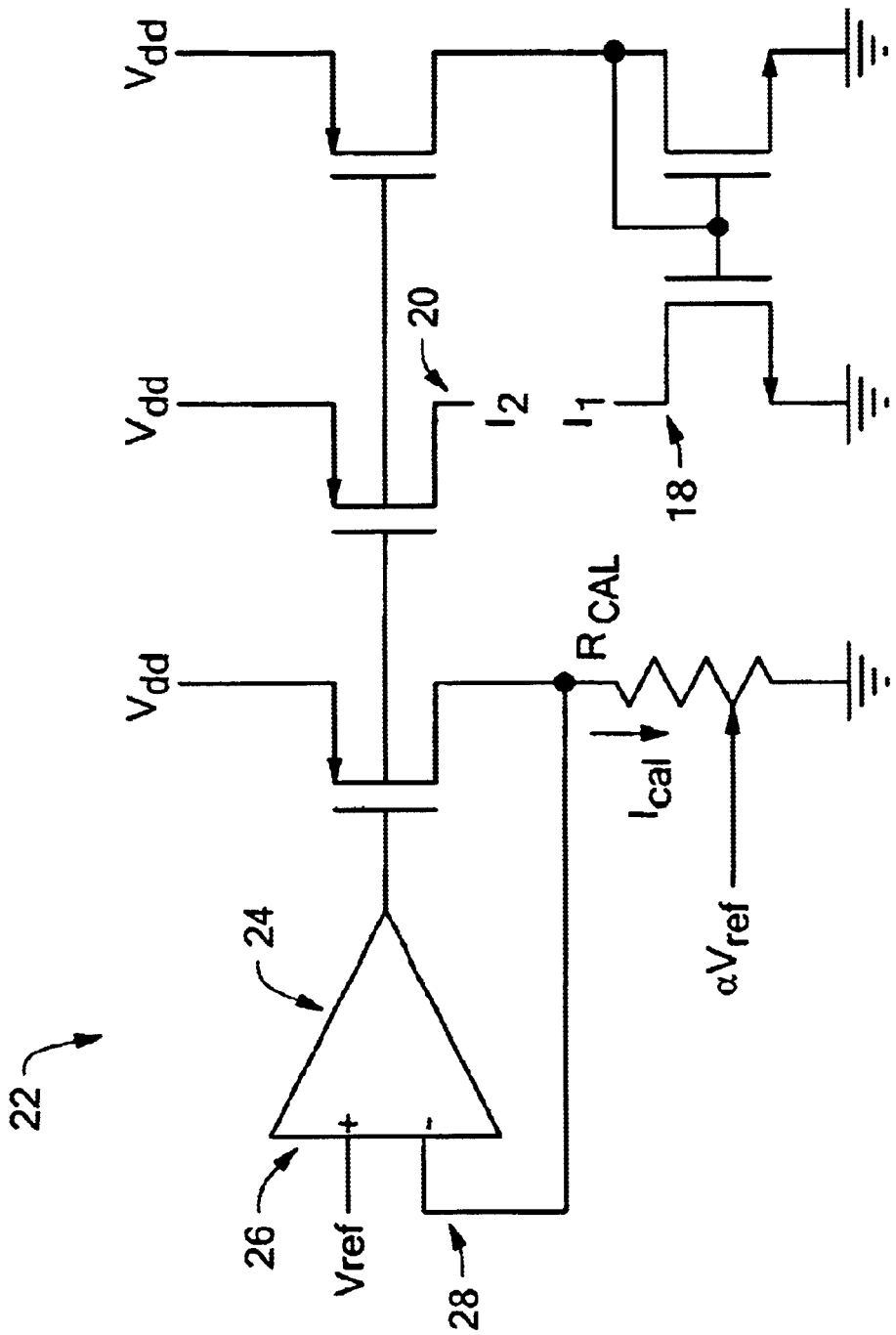
FIG. 4 schematically shows a second exemplary current source that may be used in illustrative embodiments of the invention.

FIG. 4 schematically shows an alternative embodiment of the current mirror shown in FIG. 3. In addition to the elements shown in FIG. 3, this embodiment also includes a correction input 30 for applying a correction voltage as a function of the reference voltage Vref. For example, the correction voltage may be a positive or negative percentage of the reference voltage (i.e., alpha*reference voltage Vref). Accordingly, in this embodiment, the calibration resistor Rcal may be considered to be two series connected resistors (not shown). The two resistors include a top resistor connected in series with a bottom resistor that is connected to ground. The correction voltage thus is applied to the node connecting such resistors. The voltage across the upper resistor thus equals:

$$(Vref - alpha * Vref)$$

This changes the calibration current Ical to be: (Vref−alpha*Vref)/(Resistance of the top resistor). Accordingly, rather than modifying the calibration resistor Rcal, a user may modify the frequency of the output signal by applying this correction voltage. For example, the frequency may be increased by applying a negative correction voltage (i.e., alpha is a negative number), or decreased by applying a positive correction voltage (i.e., alpha is a positive number).

Figure 5:
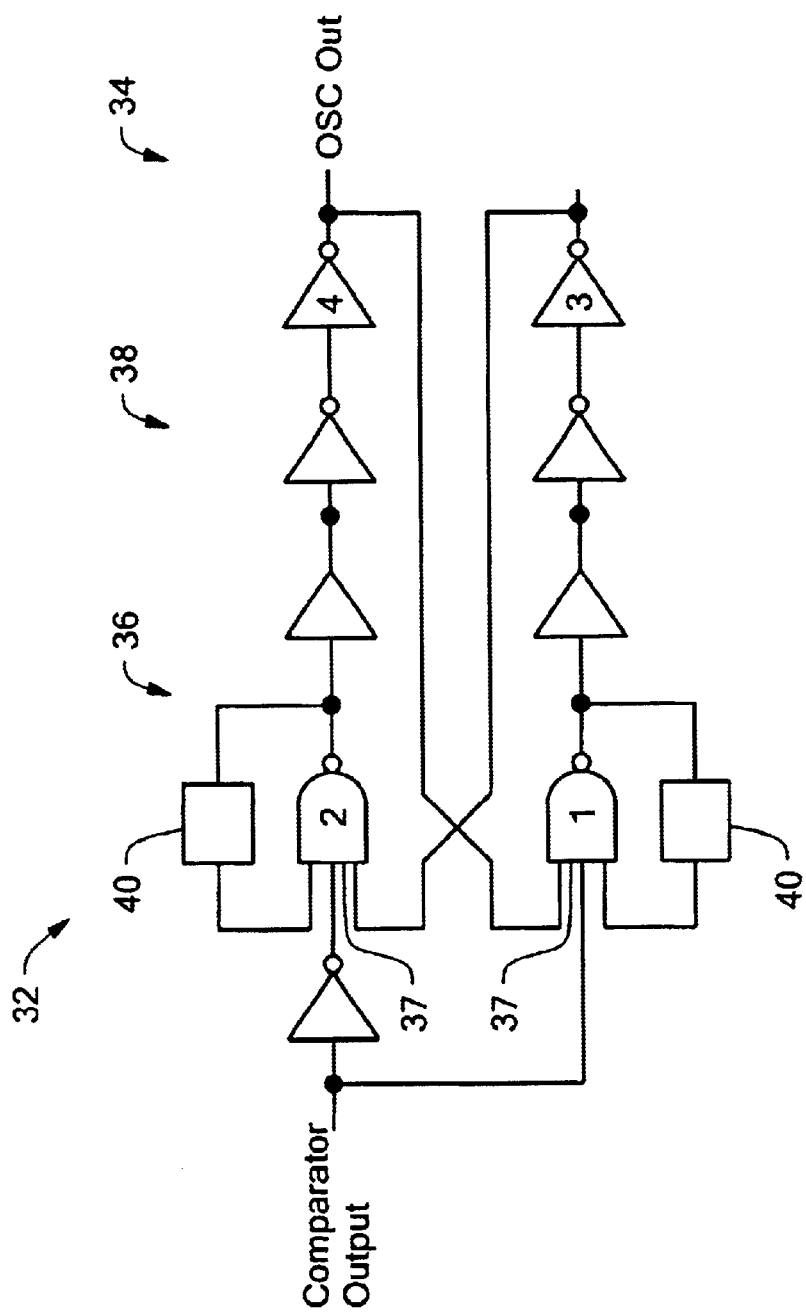
FIG. 5 schematically shows an illustrative anti-jitter circuit that may be coupled with the output of the oscillator shown in FIGS. 1A and 1B.

Noise in the oscillator 10 undesirably can produce false clocks at the output of the circuit. To minimize this effect, illustrative embodiments couple a circuit designed to reject false triggering (also referred to herein as "glitches") to the output of the oscillator 10. FIG. 5 schematically shows an exemplary glitch rejecting module 32 configured in accordance with the illustrative embodiment of the invention. This module 32 receives the output signal from the oscillator 10, and transmits its output without additional noise. If the output signal from the oscillator 10 has no noise, then the output 34 of the module 32 produces a substantially exact copy of the output signal. Conversely, when the comparator 12 switches from one state to another, there is a delay between that switching and the new state of the inputs to that comparator 12. During this time, noise to the comparator 12 can cause the output of the comparator 12 to switch back to its first state. This switching can produce a spike (i.e., a glitch) at the output of the comparator 12. If not rejected, this glitch will produce an additional clock, which is an undesirable effect. Accordingly, the module 32 inhibits the glitches produced from the comparator 12 for a fixed period of time. This time allows the comparator inputs to switch to its new state while rejecting glitches produced by the output of the comparator 12. The output 34 of the module 32 thus produces the output signal without false clocks.

To these ends, the module 32 includes a latch 36 having attached delay lines 38, and a pair of edge detectors 40 that detect a rising edge in a signal. The latch 36 includes a pair of NAND gates 37 that each have first, second, and third inputs. The first input receives the output of the other NAND gate 37, the second input receives the output signal from the oscillator 10, and the third input receives the output from one of the edge detectors 40. The edge detectors 40 normally are configured to deliver a logical one, thus having no net effect on the circuit when in such state.

When a rising edge is detected at the output of its respective NAND gate 37, the edge detector 40 delivers a logical zero signal for a relatively short time (compared to the overall delay to output signal). This logical zero signal forces the output of the module 32 to hold at its current state (either logical zero or logical one) at least until the edge detector output returns to logical one. Consequently, the output of the module 32 delivers a smoothed version of the output signal received from the oscillator 10.

Figure 6:
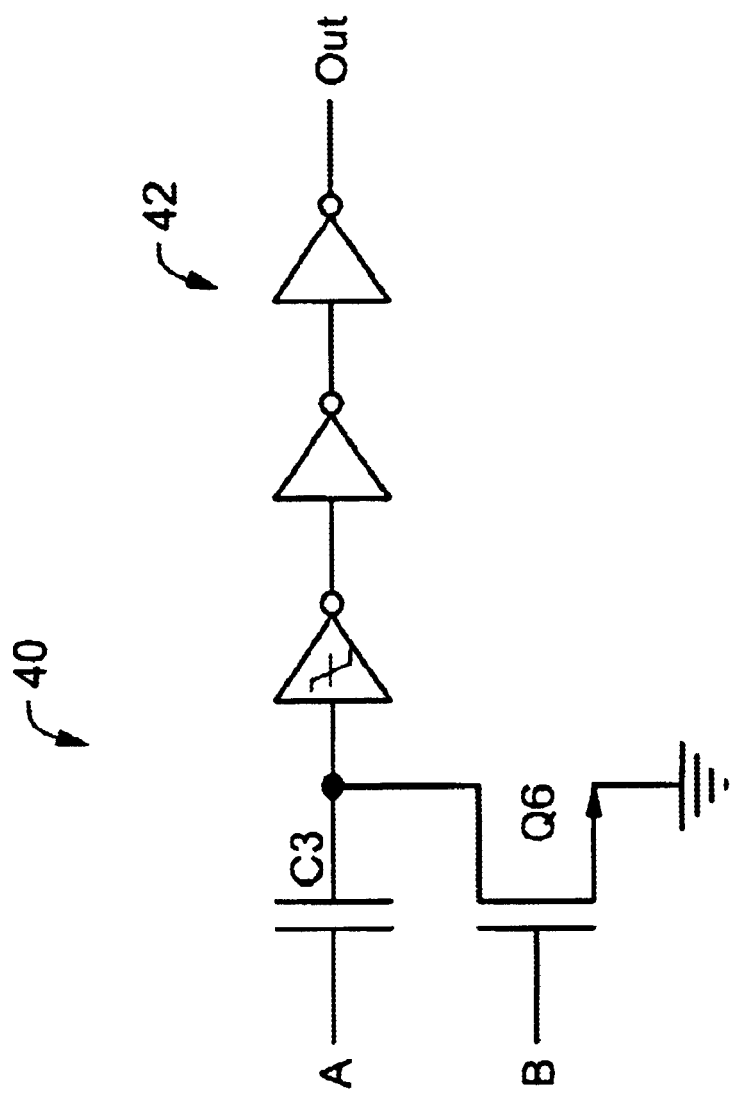
FIG. 6 schematically shows an illustrative edge detector that may be used with the anti-jitter circuit shown in FIG. 5.

FIG. 6 schematically shows an edge detector 40 configured in accordance with illustrative embodiments of the invention. The edge detector 40 includes a first input A to receive the output from one of the NAND gates 37, and a second input B set to a bias voltage. In addition, the edge detector 40 also has an input capacitor C3, a transistor Q6 coupled with one node (the "meeting node") of the input capacitor C3, and a delay line 42 coupled with a detector output. When the first input A is logical zero, the edge detector output is logical one (i.e., the meeting node is zero volts). Conversely, when the first input A initially receives a voltage representing a logical one value, the input capacitor C3 passes the logical one value to the meeting point node. Receipt of this logical one causes the meeting node to have a logical high value. Consequently, the output of the edge detector 40 is logical zero at this time. Substantially simultaneously, the transistor Q6 turns on, draining the charge in the input capacitor C3 at a controlled rate. This causes the voltage at the meeting node to decrease, thus returning the detector output to a logical one state. The time required for the edge detector output to return from logical zero to logical one is referred to as the "smoothing interval." Accordingly, the output signal from the module 32 holds its output signal at its current state (i.e., logical zero or logical one) for a time interval at least as long as the smoothing interval. This time thus may be modified by a number of factors, such as by changing the bias voltage, capacitance of input capacitor C3, or characteristics of transistor Q6 (e.g., area).

It should be noted that various specific elements are included as exemplary and not intended to limit the scope of the invention. For example, although discussed as being implemented in CMOS technology, other types of circuit elements may be used, such as bipolar junction transistors and discrete capacitors. As a further example, some embodiments may implement other current sources that have the noted relationship between the reference voltage Vref and the charging and discharging currents I2 and I1. As yet another example, instead of operational amplifiers, some embodiments may use other types of comparators.

Although various exemplary embodiments of the invention have been disclosed, it should be apparent to those skilled in the art that various changes and modifications can be made that will achieve some of the advantages of the invention without departing from the true scope of the invention. These and other obvious modifications are intended to be covered by the appended claims.

We claim:

1. An oscillator comprising:
   a comparator having a first input, a second input, and an output, the output being configured to produce an output voltage that is a function of the voltages at the first and second inputs, the first input being set to a reference voltage,
   a variable voltage element for delivering a second voltage to the second input, the second voltage being a function of a switched current,
   the switched current linear tracking the reference voltage.

2. The oscillator as defined by claim 1 wherein the variable voltage element comprises a capacitive element, the capacitive element having a voltage that is a function of the switched current.

3. The oscillator as defined by claim 1 further comprising:
   a set of switches that selectively deliver the switched current to the variable voltage element, the set of switches switching as a function of the comparator output voltage.

4. The oscillator as defined by claim 1 further comprising:
   a current source for producing the switched current as a function of a calibration current, the calibration current linearly tracking of the reference voltage.

5. The oscillator as defined by claim 4 wherein the current source includes a calibration resistor device that sets the calibration current.

6. The oscillator as defined by claim 5 wherein the calibration resistor device has a voltage across it that is substantially equal to the reference voltage.

7. The oscillator as defined by claim 1 further comprising an anti-glitch module having a module input coupled with the comparator output, the module also having a module output for delivering an anti-glitch output signal, the anti-glitch output signal being substantially free of induced noise.

8. The oscillator as defined by claim 7 wherein the anti-glitch module comprises a latch coupled with a delay device at a given node, the latch having an input, the anti-glitch module further including a feedback loop from the given node to the input of the latch.

9. The oscillator as defined by claim 1, wherein the variable voltage element fluctuates the second voltage about the reference voltage.

10. An oscillator comprising:
 a variable voltage element for producing a variable voltage;
 a voltage producing device producing an output voltage signal, the voltage producing device receiving a reference voltage and the variable voltage, the output voltage signal being a function of the reference voltage and the variable voltage;
 an output for transmitting the output voltage signal; the output voltage signal being in the form of an oscillating clock signal; and
 a switching arrangement for selectively delivering a drive signal to the variable voltage element based upon the output voltage signal, the drive signal being a function of the reference voltage and changing when the reference voltage changes to maintain the frequency of the output voltage.

11. The oscillator as defined by claim 10 further including a feedback loop coupling the output with the switching arrangement.

12. The oscillator as defined by claim 10 wherein the variable voltage element comprises a capacitive element having a voltage that is a function of the drive signal.

13. The oscillator as defined by claim 10 wherein the drive signal is a current.

14. The oscillator as defined by claim 13 further comprising a current source for producing the drive signal as a function of a calibration current, the calibration current being a function of the reference voltage.

15. The oscillator as defined by claim 14 wherein the current source includes a calibration resistor device that sets the calibration current, the calibration resistor device having a voltage across it that is substantially equal to the reference voltage.

16. The oscillator as defined by claim 10 wherein the voltage producing device is a comparator.

17. An oscillator comprising:
 means for producing a variable input voltage;
 means for generating an output voltage signal in the form of an oscillating clock signal, means for generating receiving a reference voltage and the variable input voltage, the output voltage signal being a function of the reference voltage and the variable input voltage; and
 means for selectively delivering a drive signal to the producing means based upon the output voltage signal, the drive signal linearly tracking the reference voltage and changing when the reference voltage changes to maintain the frequency of the output voltage signal.

18. The oscillator as defined by claim 17 further comprising:
 means for permitting transmission of the output voltage signal.

19. The oscillator as defined by claim 18 further comprising feedback means for electrically coupling the permitting means with the producing means.

20. The oscillator as defined by claim 17 further including means for generating the drive signal.

21. The oscillator as defined by claim 16 further including means for minimizing glitches in the output voltage signal.

* * * * *

UNITED STATES PATENT AND TRADEMARK OFFICE
CERTIFICATE OF CORRECTION

PATENT NO. : 6,853,258 B2 Page 1 of 1
DATED : February 8, 2005
INVENTOR(S) : Christopher M. Toliver et al.

It is certified that error appears in the above-identified patent and that said Letters Patent is hereby corrected as shown below:

<u>Column 8,</u>
Line 43, replace "linear" with -- linearly --.
Line 56, delete "of" before "the"

<u>Column 10,</u>
Line 13, insert -- the -- before "means"

Signed and Sealed this

Tenth Day of May, 2005

JON W. DUDAS
*Director of the United States Patent and Trademark Office*